(12) United States Patent
Li et al.

(10) Patent No.: US 6,495,770 B2
(45) Date of Patent: Dec. 17, 2002

(54) ELECTRONIC ASSEMBLY PROVIDING SHUNTING OF ELECTRICAL CURRENT

(75) Inventors: Yuan-Liang Li, Chandler, AZ (US); David G. Figueroa, Mesa, AZ (US); Priyavadan R. Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 09/730,210

(22) Filed: Dec. 4, 2000

(65) Prior Publication Data

US 2002/0066591 A1 Jun. 6, 2002

(51) Int. Cl.[7] .................................................. H05K 1/11
(52) U.S. Cl. ........................ 174/255; 174/262; 174/264; 361/780; 361/783; 361/791; 361/794; 257/700; 257/758
(58) Field of Search ................................ 174/260, 255, 174/262, 263, 264, 265, 266; 361/780, 783, 792, 793, 794, 795, 791; 257/691, 700, 758

(56) References Cited

U.S. PATENT DOCUMENTS

| | | | | |
|---|---|---|---|---|
| 5,191,174 A | * | 3/1993 | Chang et al. | 174/266 |
| 5,293,502 A | * | 3/1994 | Kimura et al. | 174/250 |
| 5,719,750 A | * | 2/1998 | Iwane | 174/255 |
| 5,774,340 A | * | 6/1998 | Chang et al. | 174/255 |
| 5,856,636 A | * | 1/1999 | Sanso | 174/255 |
| 6,006,428 A | * | 12/1999 | Feilchenfeld et al. | 174/255 |
| 6,184,477 B1 | * | 2/2001 | Tanahashi | 174/261 |
| 6,229,095 B1 | * | 5/2001 | Kobayashi | 174/255 |

* cited by examiner

*Primary Examiner*—Kamand Cuneo
*Assistant Examiner*—José H. Alcala
(74) *Attorney, Agent, or Firm*—Blakely, Sokoloff, Taylor & Zafman LLP

(57) ABSTRACT

The invention provides an electronic assembly including a semiconductor chip and a semiconductor package substrate having power and ground shunts. The power and ground shunts of the semiconductor chip include contact pads on a surface thereof that are electrically connected to one another to protect electrical signal contacts on the contact pads from high, low-frequency current. The power shunt in the semiconductor package substrate connects one power plane to another and the ground shunts in the semiconductor package substrate connects one ground plane to another. The power and ground shunts in the semiconductor package substrate dictate terminal pins thereon from high, low-frequency current.

20 Claims, 4 Drawing Sheets

ELECTRONIC ASSEMBLY PROVIDING SHUNTING OF ELECTRICAL CURRENT

BACKGROUND OF THE INVENTION

1). Field of the Invention

This invention relates to an electronic assembly including a semiconductor package substrate, a semiconductor chip mounted to the substrate, and a socket for the substrate.

2). Discussion of Related Art

Integrated circuits are manufactured on semiconductor substrates and may include a plurality of electrical components such as transistors, diodes, resistors, and capacitors connected to one another through metal lines and vias above the electrical components to form a semiconductor chip.

Contact pads are formed on a surface of the semiconductor chip and other ones of the metal lines and vias connect selected ones of the contact pads to selected terminals of selected ones of the electrical components. These contact pads include voltage and drain contact pads and other ones of the contact pads include input signal and output signal contact pads. Solder balls or other electrical contacts are usually formed on the contact pads. A solder ball may be damaged if a current passing therethrough is very high, such as often occurs in solder balls that are used for providing electrical voltage to or providing electrical drain from the integrated circuit.

Similar problems exist in vias and pins of a semiconductor package substrate to which such a semiconductor chip is mounted. Terminal pins are often provided on a surface of the semiconductor package substrate opposing a surface to which the semiconductor chip is mounted. The terminal pins are used for complementarily mating with socket openings in a socket substrate. These terminal pins or the sockets may be damaged by power or ground currents that are very high.

BRIEF DESCRIPTION OF THE DRAWINGS

The invention is described by way of example with reference to the accompanying drawings wherein.

DETAILED DESCRIPTION OF THE INVENTION

Figure 1:
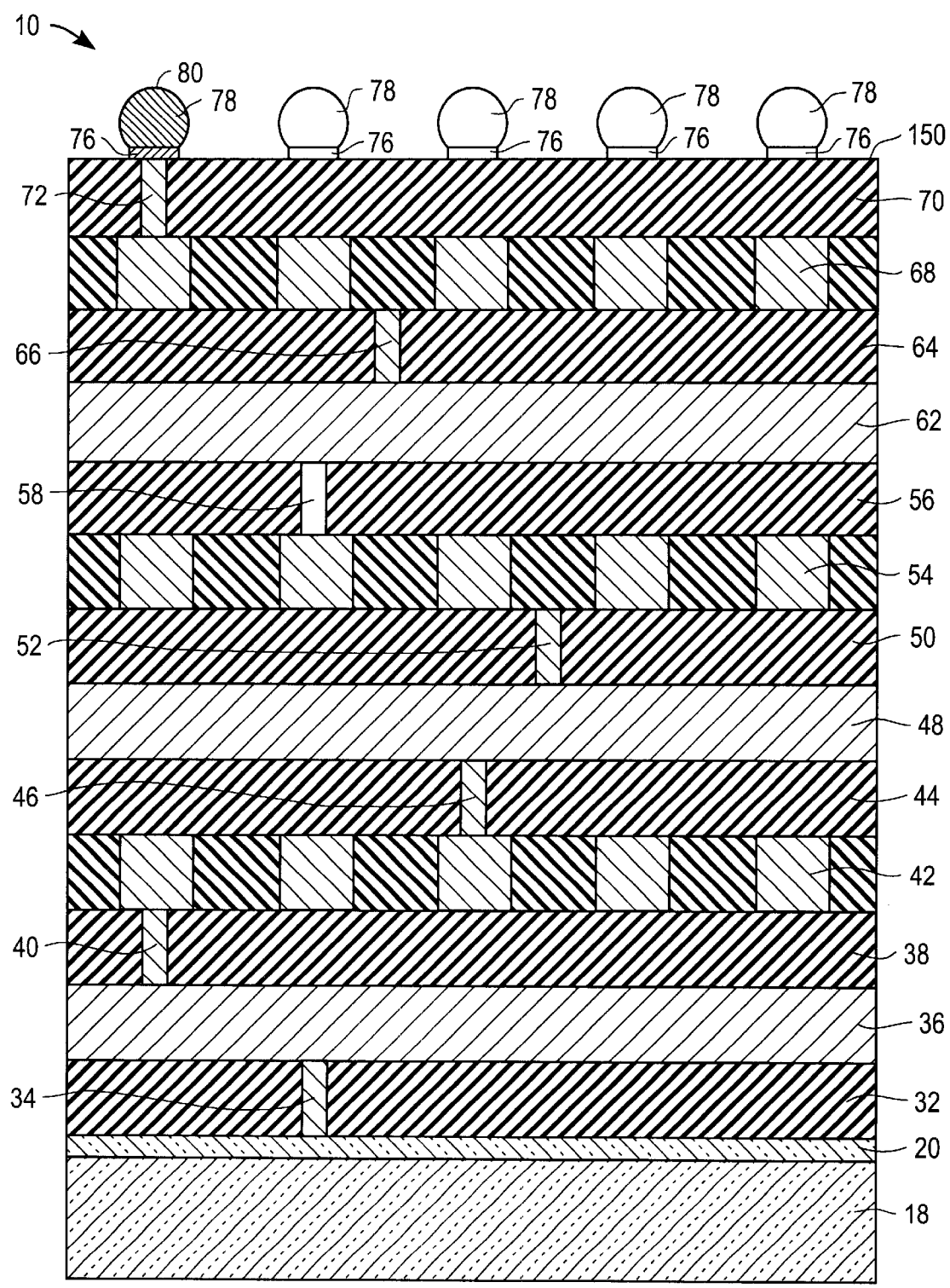
FIG. 1 is a cross-sectional side view of a semiconductor chip according to an embodiment of the invention.
Figure 2:
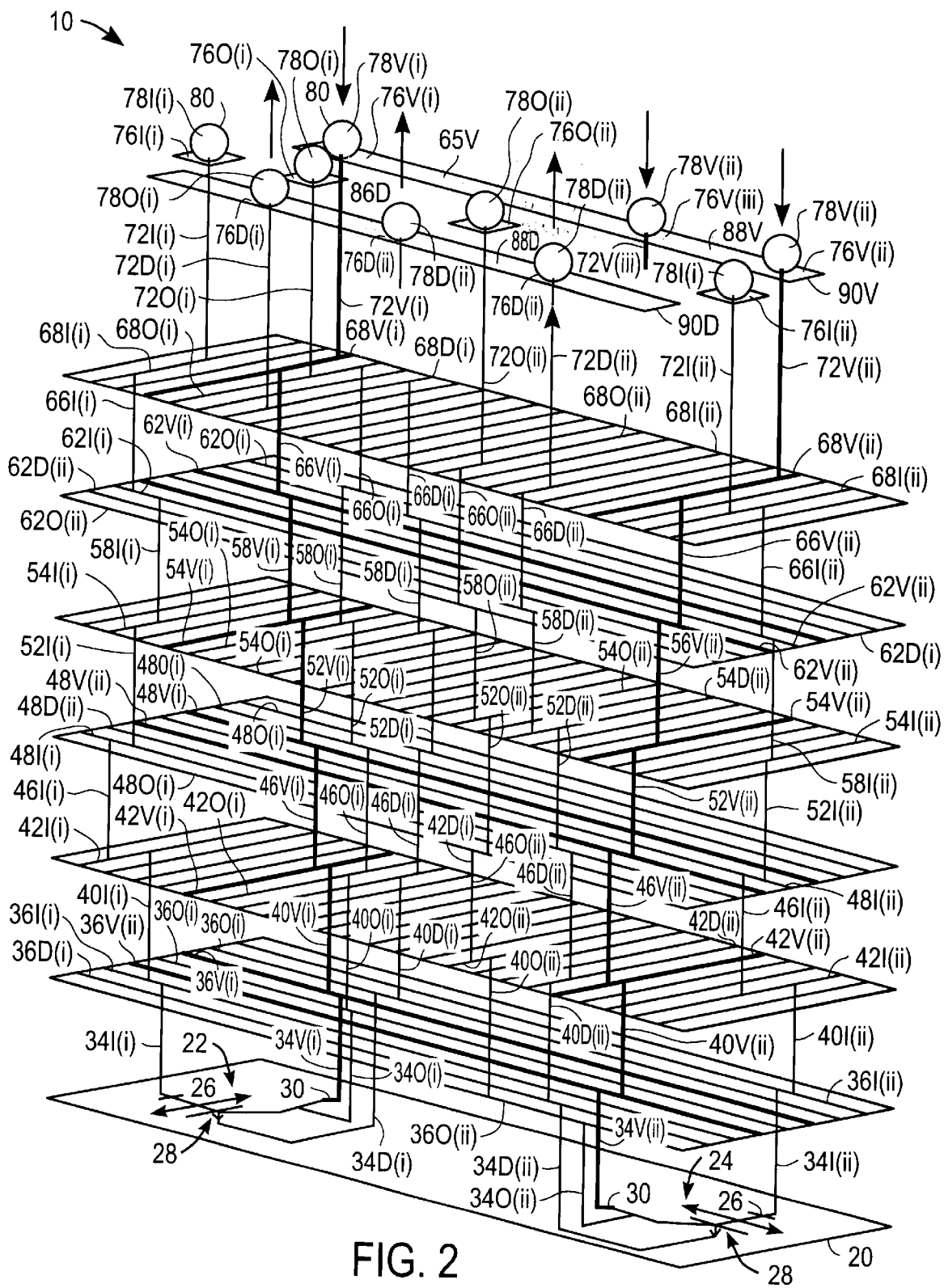
FIG. 2 is a perspective view of conducting components of the semiconductor chip.
Figure 3:
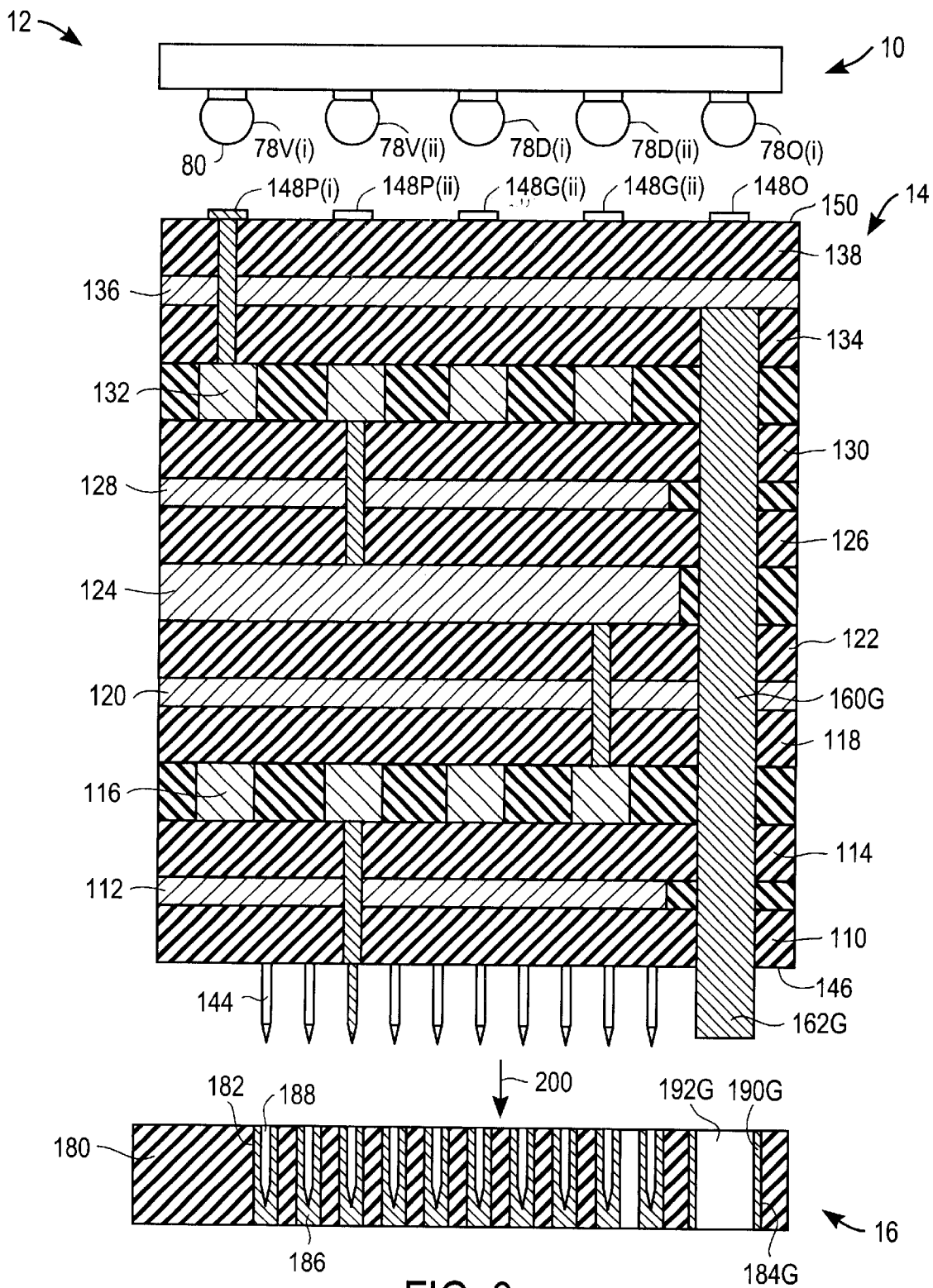
FIG. 3 is a cross-sectional side view of an electronic assembly according to an embodiment of the invention, including a semiconductor package substrate according to an embodiment of the invention, the semiconductor chip, and a socket substrate according to an embodiment of the invention.
Figure 4:
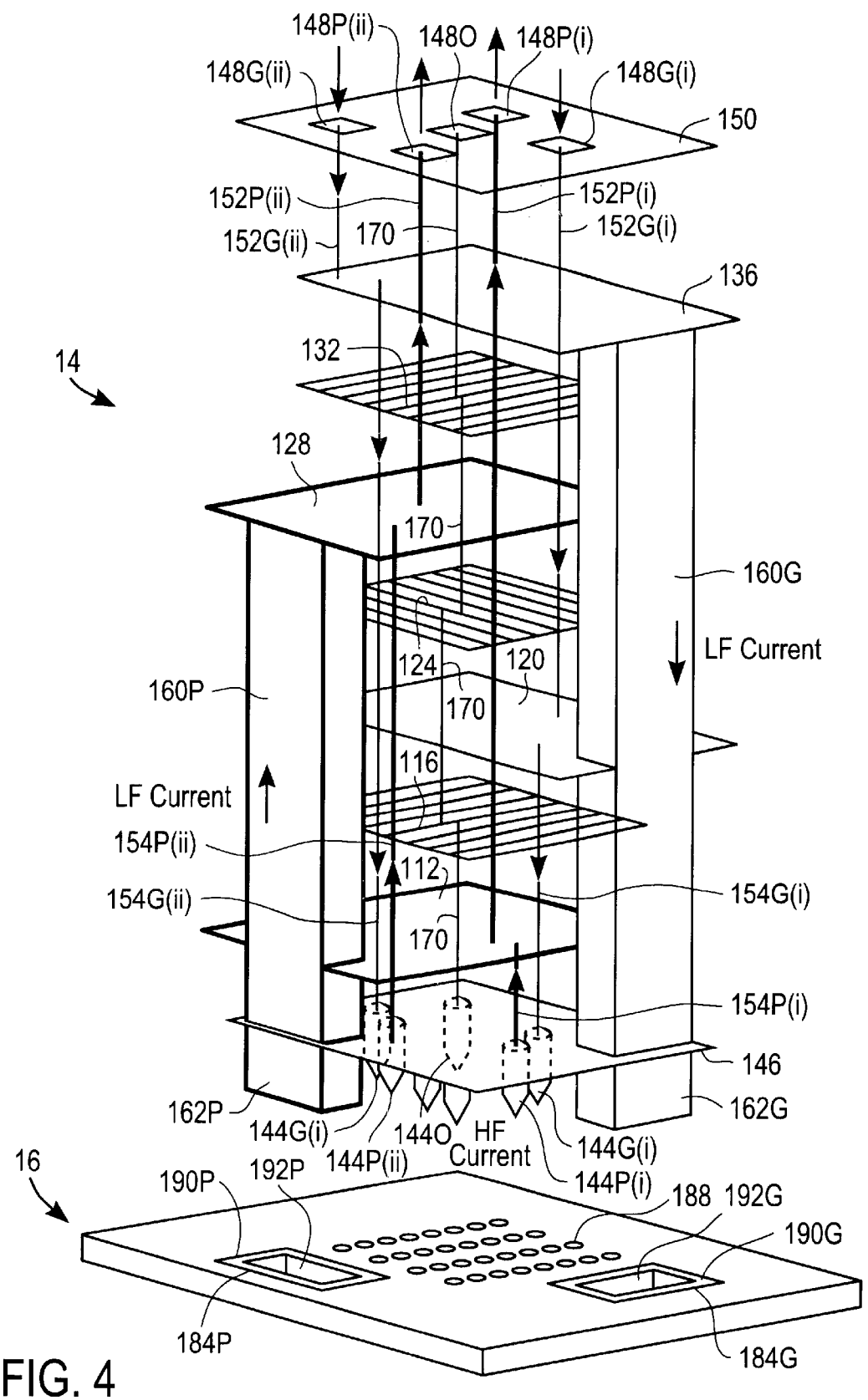
FIG. 4 is a perspective view of conducting components of the semiconductor package substrate, and of the socket.

FIG. 1 and FIG. 2 of the accompanying drawings illustrate a semiconductor chip 10 according to an embodiment of the invention. FIG. 3 illustrates an electronic assembly 12, according to an embodiment of the invention, including the semiconductor chip 10, a semiconductor package substrate 14, and a socket 16. FIG. 4 illustrates the semiconductor package substrate 14 and the socket 16 in more detail.

Referring to FIGS. 1 and 2, the manufacture of the semiconductor chip is now described in more detail. First, the semiconductor substrate 18 is provided and an integrated circuit 20 is formed thereon according to conventional principles. The integrated circuit 20 includes many transistors, capacitors, diodes, resistors and other electrical components. By way of example, two flip-flops 22 and 24 are shown. Each flip-flop 22 or 24 includes a diode 26, a transistor 28, and a resistor 30. The diode 26 is connected to a gate of the transistor 28 and the resistor 30 is connected to a source of the transistor 28. Connections between the electrical components 26, 28 and 30 are made according to conventional principles utilizing upper level metal lines, and is not further elaborated on herein.

A lower insulation layer 32 is formed onto the integrated circuit 20. Vias 34 are formed in the lower insulation layer 32.

A first layer of metal lines 36 is formed on the lower insulation layer 32. A first intermediary insulation layer is formed on the metal lines 36. Vias 40 are formed in the first intermediary insulation layer 38.

A second layer of metal lines 42 is formed on the first intermediary insulation layer 38. The metal lines 42 extend transversely and at right angles to the metal lines 36. A second intermediary insulation layer 44 is formed on the metal lines 42 and vias 46 are formed in the second intermediary insulation layer 44.

A third layer of metal lines 48, a third intermediary insulation layer 50, vias 52, a fourth layer of metal lines 54, a fourth intermediary insulation layer 56, and vias 58 are then formed in a manner similar to the manner in which the components 36 to 46 are formed. A fifth layer of metal lines 62, a second intermediary insulation layer 64, vias 66, metal lines 68, and an upper insulation layer 70, and vias 72 are then formed in a manner similar to the manner in which the components 48 to 58 are formed.

A controlled collapse chip connect process is then employed to form a plurality of electrical contacts 78. Each electrical contact 78 has a lower surface attached to a respective one of the contact pads 76, and an opposing surface 80 facing away from, and spaced from the respective contact pad 76.

A respective terminal of each flip-flop 22 or 24 is connected to a respective electrical contact 78 in series respectively through a respective one of the vias 34, metal lines 36, vias 40, metal lines 42, vias 46, metal lines 48, vias 52, metal lines 54, vias 58, metal lines 62, vias 66, metal lines 68, vias 72, and contact pads 76.

For example, the source of the transistor 28 of the flip-flop 22 is connected through the resistor 30 of the flip-flop 22 to a voltage via 34V(i). The voltage via 34V(i) is also connected to a voltage line 36V(i). A voltage via 40V(i) connects the voltage line 36V(i) to a voltage line 42V(i). In a similar manner, a series connection is followed from the voltage line 42V(i) to the voltage via 46V(i), a voltage line 48V(i), a voltage via 52V(i), a voltage line 54V(i), a voltage via 58V(i), a voltage line 62V(i), a voltage via 66V(i), a voltage line 68V(i), and a voltage via 72V(i). The voltage via 72V(i) is connected to a voltage contact pad 76V(i). An electrical voltage contact 78V(i) is attached to the voltage contact pad 76V(i). High-frequency current can be supplied through the electric voltage contact 78V(i) to the resistor 30 of the flip-flop 22.

Similarly, the source of the transistor 28 of the flip-flop 24 is connected through the resistor 30 of the flip-flop 24 to a voltage via 34V(ii). The voltage via 34V(ii) is also connected to a voltage line 36V(ii). A voltage via 40V(ii) connects the voltage line 36V(ii) to a voltage line 42V(ii). In a similar manner, a series connection is followed from the voltage line 42V(ii) to the voltage via 46V(ii), a voltage line 48V(ii), a voltage via 52V(ii), a voltage line 54V(ii), a voltage via 58V(ii), a voltage line 62V(ii), a voltage via 66V(ii), a voltage line 68V(ii), and a voltage via 72V(ii). The voltage via 72V(ii) is connected to a voltage contact pad 76V(ii). An electrical voltage contact 78V(ii) is attached to the voltage contact pad 76V(ii). High-frequency current can be supplied through the electric voltage contact 78V(ii) to the resistor 30 of the flip-flop 24.

A further voltage contact pad 76V(iii) is located between the voltage contact pads 76V(i) and 76V(ii) and is connected to a respective source of a transistor (not shown) in the integrated circuit 20. The respective electric voltage contact 78V(iii) is attached to the voltage contact pad 76V(iii).

A voltage shunt bar 90V is formed on a surface 150 of the upper insulation layer 70 and includes the voltage contact pads 76V(i), 76V(ii), and 76V(iii). A voltage shunt connection 86V of a voltage shunt bar 90V connects the voltage contact pad 76V(i) to the voltage contact pad 76V(iii). Another voltage shunt connection 88V of the voltage shunt bar 90V connects the voltage contact pad 76V(iii) to the voltage contact pad 76V(ii). The voltage vias 72V(i), 72V(ii), and 72V(iii) are thereby electrically connected to one another. Low-frequency current in one of the voltage vias 72V(i), 72V(ii), or 72V(iii) is split between the electric voltage contacts 78V(i), 78V(ii), and 78V(iii). For example, low-frequency current can be provided by the voltage via 72V(ii) through metal lines and vias connected thereto to the transistor 28 of the flip-flop 24. The voltage via 72V(ii) receives current from the voltage shunt bar 90V which, in turn, receives current through all of the electric voltage contacts 78V(i), 78V(ii), and 78V(iii).

The current flowing through a respective one of the electric voltage contacts 78V(i), 78V(ii), or 78V(iii) is approximately equal to the amount of current through the voltage via 72V(ii) divided by the number of electric voltage contacts 78V(i), 78V(ii), and 78V(iii). In the example illustrated, for example, there are three electric voltage contacts 78V(i), 78V(ii), and 78V(iii), so that a current flowing through a respective one of the electric voltage contacts 78V(i), 78V(ii), or 78V(iii) is approximately one third of the current flowing through the voltage via 72V(ii). Without the voltage shunt connections 88V or 86V, all the current flowing through the voltage via 72V(ii) would flow through the electric voltage contact 78V(ii). The voltage shunt connections 88V and 86V thus protect the electric voltage contact 78V(ii) from high, low-frequency currents which could burn the electric voltage contact 78V(ii).

Similarly, the drain of the transistor 28 of the flip-flop 22 is connected to the flip-flop 22 to a drain via 34D(i). The drain via 34D(i) is also connected to a drain line 36D(i). A drain via 40D(i) connects the drain line 36D(i) to a drain line 42D(i). In a similar manner, a series connection is followed from the drain line 42D(i) to the drain via 46D(i), a drain line 48D(i), a drain via 52D(i), a drain line 54D(i), a drain via 58D(i), a drain line 62D(i), a drain via 66D(i), a drain line 68D(i), and a drain via 72D(i). The drain via 72D(i) is connected to a drain contact pad 76D(i). An electrical drain contact 78D(i) is attached to the drain contact pad 76D(i). High-frequency current can be conducted from the drain of the transistor 28 of the flip-flop 22 to the electric drain contact 78D(i).

Similarly, the drain of the transistor 28 of the flip-flop 24 is connected to the flip-flop 24 to a drain via 34D(ii). The drain via 34D(ii) is also connected to a drain line 36D(ii). A drain via 40D(ii) connects the drain line 36D(ii) to a drain line 42D(ii). In a similar manner, a series connection is followed from the drain line 42D(ii) to the drain via 46D(ii), a drain line 48D(ii), a drain via 52D(ii), a drain line 54D(ii), a drain via 58D(ii), a drain line 62D(ii), a drain via 66D(ii), a drain line 68D(ii), and a drain via 72D(ii). The drain via 72D(ii) is connected to a drain contact pad 76D(ii). An electrical drain contact 78D(ii) is attached to the drain contact pad 76D(ii). High-frequency current can be conducted from the drain of the transistor 28 of the flip-flop 24 to the electric drain contact 78D(ii).

A further drain contact pad 76D(iii) is located between the drain contact pads 76V(i) and 76V(ii) and is connected to a respective source of a transistor (not shown) in the integrated circuit 20. The respective electric drain contact 78D(iii) is attached to the drain contact pad 76D(iii).

A drain shunt bar 90D is formed on the surface of the upper insulation layer 70 and includes the drain contact pads 76D(i), 76D(ii), and 76D(iii). A drain shunt connection 86D of the drain shunt bar 90D connects the drain contact pad 76D(i) to the drain contact pad 76D(iii). Another drain shunt connection 88D of the drain shunt bar 90D connects the drain contact pads 76D(iii) to the drain contact pad 76D(ii). The drain vias 72D(i), 72D(ii), and 72D(iii) are thereby electrically connected to one another. Low-frequency current in one of the drain vias 72D(i), 72D(ii), or 72D(iii) is split between the electric drain contact 78D(i), 78D(ii), and 78D(iii). For example, low-frequency current can flow from the transistor 30 of the flip-flop 24 through metal lines and vias connected thereto to the drain via 72D(ii). The drain via 72D(ii) provides current to the drain shunt bar 90D which, in turn, provides current through all of the electric drain contacts 78D(i), 78D(ii), and 78D(iii).

The current flowing through a respective one of the electric drain contacts 78D(i), 78D(ii), or 78D(iii) is approximately equal to the amount of current through the drain via 72D(ii) divided by the number of electric drain contacts 78D(i), 78D(ii), and 78D(iii). In the example illustrated, for example, there are three electric drain contacts 78D(i), 78D(ii), and 78D(iii), so that a current flowing through a respective one of the electric drain contacts 78D(i), 78D(ii), or 78D(iii) is approximately one third of the current flowing through the drain via 72D(ii). Without the drain shunt connections 88D or 86D, all the current flowing through the drain via 72D(ii) would flow through the electric drain contact 78D(ii). The drain shunt connections 88D and 86D thus protect the electric drain contact 78D(ii) from high, low-frequency currents which could burn the electric drain contact 78D(ii).

A terminal of the diode 26 of the flip-flop 22 is connected to an input signal via 34I(i). The input signal via 34I(i) is also connected to an input signal line 36I(i). An input signal via 40I(i) connects the input signal line 36I(i) to an input signal line 42I(i). In a similar manner, a series connection is followed from the input signal line 42I(i) to the input signal via 46I(i), an input signal line 48I(i), an input signal via 52I(i), an input signal line 54I(i), an input signal via 58I(i), an input signal line 62I(i), an input signal via 66I(i), an input signal line 68I(i), and an input signal via 72I(i). The input signal via 72I(i) is connected to an input signal contact pad 76I(i). An electrical input signal contact 78I(i) is attached to the input signal contact pad 76I(i). An input signal can be provided from the electrical input signal contact 78I(i) to the terminal of the diode 26 of the flip-flop 22.

Similarly, a terminal of the diode 26 of the flip-flop 24 is connected to an input signal via 34I(ii). The input signal via 34I(ii) is also connected to an input signal line 36I(ii). An input signal via 40I(ii) connects the input signal line 36I(ii) to an input signal line 42I(ii). In a similar manner, a series connection is followed from the input signal line 42I(ii) to the input signal via 46I(ii), an input signal line 48I(ii), an input signal via 52I(ii), an input signal line 54I(ii), an input signal via 58I(ii), an input signal line 62I(ii), an input signal via 66I(ii), an input signal line 68I(ii), and an input signal via 72I(ii). The input signal via 72I(ii) is connected to an input signal contact pad 76I(ii). An electrical input signal contact 78I(ii) is attached to the input signal contact pad 76I(ii). An input signal can be provided from the electrical drain contact 78I(ii) to the terminal of the diode 26 of the flip-flop 24.

A source of the transistor 28 of the flip-flop 22 is connected to an output signal via 34O(i). The output signal via 34O(i) is also connected to an output signal line 36O(i). An output signal via 40O(i) connects the output signal line 36O(i) to an output signal line 42O(i). In a similar manner, a series connection is followed from the output signal line 42O(i) to the output signal via 46O(i), an output signal line 48O(i), an output signal via 52O(i), an output signal line 54O(i), an output signal via 58O(i), an output signal line 62O(i), an output signal via 66O(i), an output signal line 68O(i), and an output signal via 72O(i). The output signal via 72O(i) is connected to an output signal contact pad 76O(i). An electrical output signal contact 78O(i) is attached to the output signal contact pad 76O(i). An output signal can be provided from the source of the transistor 28 of the flip-flop 22 to the electric output signal contact 78O(i).

Similarly, a source of the transistor 28 of the flip-flop 24 is connected to an output signal via 34O(ii). The output signal via 34O(ii) is also connected to an output signal line 36O(ii). An output signal via 40O(ii) connects the output signal line 36O(ii) to an output signal line 42O(ii). In a similar manner, a series connection is followed from the output signal line 42O(ii) to the output signal via 46O(ii), an output signal line 48O(ii), an output signal via 52O(ii), an output signal line 54O(ii), an output signal via 58O(ii), an output signal line 62O(ii), an output signal via 66O(ii), an output signal line 68O(ii), and an output signal via 72O(ii). The output signal via 72O(ii) is connected to an output signal contact pad 76O(ii). An electrical output signal contact 78O(ii) is attached to the output signal contact pad 76O(ii). An output signal can be provided from the source of the transistor 28 of the flip-flop 24 to the electric output signal contact 78O(ii).

High-frequency currents still follow the path of least inductance (as opposed to low-frequency current that follows the path of least resistance). High-frequency current therefore tends not to be split up by the voltage shunt bar 90V or the drain shunt bar 90D.

The manufacture of the semiconductor package substrate 14 is now described with reference to FIGS. 3 and 4. A lower insulating layer 110 is provided on which is formed a first power plane 112, followed sequentially by a first intermediate insulating layer 114, a first layer of metal lines 116, a second intermediary insulating layer 118, a first ground plane 120, a third intermediary insulating layer 122, a second layer of metal lines 124, a fourth intermediary insulating layer 126, a second power plane 128, a fifth intermediary insulating layer 130, a third layer of metal lines 132, a sixth intermediary insulating layer 134, a second ground plane 136, and an upper insulating layer 138. High-frequency terminal pins 144 are attached to a lower surface 146 of the lower insulating layer 110. Contact terminals 148 are formed on an upper surface 150 of the upper insulating layer 138.

A first power via 152P(i) connects the first power plane 112 to a first power contact terminal 148P(i). A first high-frequency power via 154P(i) connects a high-frequency power terminal pin 144P(i) to the first power plane 112. High-frequency current can be provided through the high-frequency power terminal pin 144P(i) through the first high-frequency power via 154P(i), the first power plane 112, the first power via 152P(i), to the first power contact terminal 148P(i).

A second power via 152P(ii) connects the second power plane 128 to a second power contact terminal pin 148P(ii). A second high-frequency power via 154P(ii) connects a high-frequency power terminal 144P(ii) to the second power plane 128. High-frequency current can be provided through the high-frequency power terminal pin 144P(ii) through the second high-frequency power via 154P(ii), the second power plane 128, the second power via 152P(ii), to the second power contact terminal 148P(ii).

A first ground via 152G(i) connects the first ground plane 120 to a first ground contact terminal 148G(i). A first high-frequency ground via 154G(i) connects a high-frequency ground terminal pin 144G(i) to the first ground plane 120. High-frequency ground current can flow from the first ground terminal pin 144G(i) to the first ground via 152G(i), and then to the first ground plane 120, and from there through the first high-frequency ground via 154G(i) to the first high-frequency ground terminal 144G(i).

A second ground via 152G(ii) connects the second ground plane 136 to a second ground contact terminal 148G(ii). A second high-frequency ground via 154G(ii) connects a high-frequency ground terminal pin 144G(ii) to the second ground plane 136. High-frequency ground current can flow from the second ground terminal pin 144 G(ii) to the second ground via 152G(ii), and then to the second ground plane 136, and from there through the second high-frequency ground via 154G(ii) to the second high-frequency ground terminal 144G(ii).

All the vias 152 and 154 are located in and extend partially through the insulating layers of semiconductor package substrate 14. The vias 152 and 154 are only connected at their ends to conducting components. The first power via 152P(i), for example, is not connected to the first or second ground planes 112 or 128 or to the second power plane 136.

The semiconductor package substrate 14 is further formed with a power shunt bar 160P and a ground shunt bar 160G. The power shunt bar 160P has a lower end protruding from the lower surface 146 of the lower insulating layer 110 to form a power shunt terminal 162P. An upper end of the power shunt bar 160P is connected to the second power plane 128. The first power plane 112 is connected to the power shunt bar 160P at a location between the power shunt terminal 162P and the upper end of the power shunt bar 160P.

Low-frequency power current can be provided through the power shunt terminal 162P to the power shunt bar 160P. The low-frequency power current can then flow through either the first power plane 112 or the second power plane 128, to either the first power contact terminal 148P(i) or the second power contact terminal 148P(ii), or to both of them. It can thus be seen that power is supplied to the power contact terminals 148P(i) and 148P(ii) without having to pass current through the high-frequency power terminal pins 144P(i) or 144P(ii). The high-frequency power terminal pins 144P(i) and 144P(ii) and the high-frequency power vias 154P(i) and 154P(ii) are thus protected from high, low-frequency currents. High-frequency current can still flow through the high-frequency power terminals 144P(i) and 144P(ii) and the high-frequency power vias 154P(i) and 154P(ii).

The ground shunt bar 160P has a lower end protruding from the lower surface 146 of the lower insulating layer 110 to form a ground shunt terminal 162P. An upper end of the ground shunt bar 160P is connected to the second ground plane 136. The first ground plane 120 is connected to the ground shunt bar 160P at a location between the ground shunt terminal 162P and the upper end of the ground shunt bar 160P.

Low-frequency ground current can flow from either the first ground terminal 148G(i) or the first ground terminal 148G(ii), or both, to either the first ground plane 120 or the second ground plane 136. The ground current then flows from either the first ground plane 120 or the second ground plane 136, or both, to the ground shunt bar 160G, through which the current then flows to the ground shunt terminal 162G. As such, the high-frequency ground terminal pins 144G(i) and 144G(ii) are protected from high, low-frequency ground current, as are the first and second high-frequency ground vias 154G(i) and 154G(ii).

The semiconductor package also includes interconnection for input and output signals. A respective series connection connects a respective output contact terminal 148O to a respective output terminal pin 144O. The series connection includes a metal line 132, 124, and 116 and output vias 170 connected in series. A similar series connects a respective input terminal pin (not shown) of the pins 144 to a respective input contact terminal (not shown) of the terminals 144.

FIG. 3 illustrates how the semiconductor chip 10 is attached to the semiconductor package substrate 14. The surface 80 of a respective one of the electrical signal contacts 78 is located against a respective one of the contact terminals 148. The electric voltage contact 78V(i) is located against the power contact terminal 148P(i). The electric voltage contact 78V(ii) is located against the power contact terminal 148P(ii). The electric drain contact 78D(i) is located against the ground contact terminal 148G(i). The electric drain contact 78D(ii) is located against the ground contact terminal 148G(ii). The electric output signal contact 78O(i) is located against the output signal terminal 148O and a similar connection is made between the electric input signal contact 78I(i) and the input signal terminal (not shown). The semiconductor chip 10 and the package substrate 14 are then together located in an oven which heats the electric contacts 78, reflowing them over the contact terminals 148, whereafter the semiconductor chip 10 and the package substrate 14 are cooled, thereby attaching the electric contacts 78 to the contact terminals 148.

The socket 16 includes a socket substrate 180 having a plurality of high-frequency openings 182, a power shunt opening 184P, and a ground shunt opening 184G formed therein. A respective high-frequency contact 186 is formed within a respective one of the high-frequency openings 182. Each high-frequency contact 186 has a respective high-frequency socket 188 therein. The high-frequency socket corresponds with a shape of a respective one of the high-frequency terminal pins 144. An electrical power shunt contact 190P and an electrical ground shunt contact 190G are formed within the power shunt opening 184P and the ground shunt opening 184G, respectively. The electrical power shunt contact 190P forms a power shunt socket 192P and the electrical ground shunt contact forms a ground shunt socket 192G. The power shunt socket 192P corresponds in shape to a shape of the power shunt terminal 162P and the ground shunt socket 192G corresponds in shape to the ground shunt terminal 162G.

The semiconductor package substrate 14, with the semiconductor chip 10 mounted thereto, is moved in a direction 200 towards the socket substrate 180. Movement in a direction 200 causes simultaneous mating of a respective one of the high-frequency terminal pins 144 with a respective one of the high-frequency sockets 188, mating of the power 162P with the power shunt socket 192P, and mating of the ground shunt terminal 162G with the ground shunt socket 192G. The socket 16 can be mounted to a motherboard and each of the high-frequency contacts 186, the electrical power shunt contact 190P, and the ground shunt contact 190G can be electrically connected to the motherboard. Movement in the direction 200 will thus electrically connect the semiconductor package substrate 14 and the semiconductor chip 10 to the motherboards.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor package substrate comprising:
    a first insulating layer;
    a first power plane over the first insulation layer;
    an intermediate insulating layer over the first power plane;
    a second power plane over the intermediate insulting layer;
    a final insulating layer over the second power plane;
    first and second power contact terminals on the final insulating layer;
    at least first power via in the final and intermediate insulating layers, connecting the first power plane to the first contact terminal;
    at least second power via in the final insulating layer, connecting the second power plane to the second contact terminal; and
    a power shunt bar connecting the first power plane to the second power plane.

2. The semiconductor package substrate of claim 1 wherein the power shunt bar projects from a first surface of the first insulating layer to form a projecting shunt power terminal.

3. The semiconductor package substrate of claim 2 further comprising:
    first and second high-frequency power terminals on a first surface of the first insulating layer;
    at least a first high-frequency power via in the first insulating layer, connecting the first power plane to the first high-frequency power terminal; and
    at least a second high-frequency power via in the first insulating layer, and the intermediate insulating layer, connecting the second power plane to the second high-frequency power terminal.

4. The semiconductor package substrate of claim 3 wherein the high frequency power terminals are high-frequency power pins extending from the first surface of the first insulating layer.

5. The semiconductor package substrate of claim 1 further comprising:
    a first ground plane over the first insulating layer;
    a second ground plane over the intermediate insulating layer;
    first and second ground contact terminals on the final insulating layer;

at least first ground via in the final and intermediate insulating layers, connecting the first ground plane to the first contact terminal;

at least second ground via in the final insulating layer, connecting second ground plane to the second contact terminal; and a ground shunt bar connecting the first ground plane to the second ground plane.

6. The semiconductor package substrate of claim 5 wherein the ground shunt bar projects from a first surface of the first insulating layer to form a projecting shunt ground terminal.

7. The semiconductor package substrate of claim 6 further comprising:

first and second high-frequency ground terminals on a first surface of the first insulating layer;

at least a first high-frequency ground via in the first insulating layer, connecting the first ground plane to the first high-frequency ground terminal; and at least a second high-frequency ground via in the first insulating layer and the intermediate insulating layer, connecting the second ground plane to the second high-frequency ground terminal.

8. The semiconductor package substrate of claim 7 wherein the high-frequency ground terminals are high-frequency ground pins extending from the first surface of the first insulating layer.

9. A semiconductor package substrate comprising:

a first insulating layer;

a first conductive plane over the first insulating layer;

a first intermediate insulating layer over the first conductive plane;

a second conductive plane over the first intermediate insulating layer;

a second intermediate insulating layer over the second conductive plane;

a third conductive plane over the second intermediate insulating layer;

a third intermediate insulating layer over the third conductive plane;

a fourth conductive plane over the third intermediate insulating layer;

a final insulating layer over the fourth conductive plane, one of the conductive planes being a first power plane, another one being a second power plane, another one being a first ground plane, another one being a second ground plane;

first and second power contact terminals on the final insulating layer;

first and second ground contact terminals on the final insulting layer;

at least a first power via connecting the first power plane to the first contact terminal;

at least a second power via connecting the second power plane to the second power contact terminal;

at least a first ground via connecting the first ground plane to the first ground contact terminal;

at least a second ground via connecting the second ground plane to the ground second contact terminal;

a power shunt bar connecting the first power plane to the second power plane; and a ground shunt bar connecting the first ground plane to the second ground plane.

10. The semiconductor package substrate of claim 9 wherein the power shunt bar projects from a first surface of the first insulating layer to form a projecting shunt power terminal, and the ground shunt bar projects from a first surface of the first insulating layer to form a projecting shunt ground terminal.

11. The semiconductor package substrate of claim 10, further comprising:

first and second high-frequency power terminals on a first surface of the first insulating layer;

first and second high-frequency ground terminals on the first surface of the first insulating layer;

at least a first high-frequency power via connecting the first power plane to the first high-frequency power terminal;

at least a second high-frequency power via connecting the second power plane to the second high-frequency power terminal;

at least a first high-frequency ground via connecting the first ground plane to the first high-frequency ground terminal;

at least a second high-frequency ground via connecting the second ground plane to the second high-frequency ground terminal.

12. An electronic assembly comprising:

a semiconductor package substrate including:
a first insulating layer;
a first power plane over the first insulation layer;
an intermediate insulating layer over the first power plane;
a second power plane over the intermediate insulting layer;
a final insulating layer over the second power plane;
first and second power contact terminals on the final insulating layer;
at least first power via in the final and intermediate insulating layers, connecting the first power plane to the first contact terminal;
at least second power via in the final insulating layer, connecting the second power plane to the second contact terminal; and
a power shunt bar connecting the first power plane to the second power plane; and a semiconductor chip mounted to the package substrate.

13. The electronic assembly of claim 12 wherein the semiconductor chip includes:

a semiconductor substrate;

an integrated circuit of electrical components on the semiconductor substrate;

a first insulation layer on the integrated circuit;

a plurality of voltage lines over the first insulation layer;

a plurality of voltage vias in the first insulation layer, each connecting a respective electrical component to a respective voltage line;

a final insulation layer over the voltage lines;

a plurality of voltage contact pads on the final insulation layer;

a plurality of voltage vias in the final insulation layer, each electrically connecting a respective voltage line to a respective voltage contact pad; and a voltage shunt connection electrically connecting the voltage lines to one another.

14. The electronic assembly of claim 13 wherein the semiconductor substrate includes:

a first ground plane over the first insulating layer;

a second ground plane over the intermediate insulating layer;

first and second ground contact terminals on the final insulating layer;

at least first ground via in the final and intermediate insulating layers, connecting the first ground plane to the first contact terminal;

at least second ground via in the final insulating layer, connecting second ground plane to the second contact terminal; and a ground shunt bar connecting the first ground plane to the second ground plane.

15. The electronic assembly of claim 14 wherein the semiconductor chip includes:

a plurality of drain lines over the first insulation layer;

a plurality of drain vias in the first insulation layer, each connecting a respective electrical component to a respective drain line;

a plurality of drain contact pads on the final insulation layer;

a plurality of drain vias in the final insulation layer, each connecting a respective drain line to a respective drain contact pad; and a drain shunt connection electrically connecting the drain lines to one another.

16. An electronic assembly comprising:

a semiconductor package substrate including:
  a first insulating layer;
  a first power plane over the first insulation layer;
  an intermediate insulating layer over the first power plane;
  a second power plane over the intermediate insulting layer;
  a final insulating layer over the second power plane;
  first and second power contact terminals on the final insulating layer;
  at least first power via in the final and intermediate insulating layers, connecting the first power plane to the first contact terminal;
  at least second power via in the final insulating layer, connecting
  the second power plane to the second contact terminal;
  a power shunt bar connecting the first power plane to the second power plane, the power shunt bar projecting from a first surface of the first insulating layer to form a power shunt terminal; and a socket including:
  a socket substrate having a power shunt opening formed therein;
  an electrical power shunt contact in the power shunt opening, the power shunt opening and the electrical contact forming a power shunt socket, the power shunt terminal being inserted into the power shunt socket and contacting the electrical power shunt contact.

17. The electronic assembly of claim 16 wherein the semiconductor package substrate further includes:

first and second high-frequency power terminals on a first surface of the first insulating layer;

at least a first high-frequency power via in the first insulating layer, connecting the first power plane to the first high-frequency power terminal; and at least a second high-frequency power via in the first insulating layer, and the intermediate insulating layer, connecting the second power plane to the second high-frequency power terminal, and the socket substrate further has a first high-frequency power opening, the socket further including:

a first electrical high-frequency power contact in the high-frequency power opening, the first high-frequency power opening and the first high-frequency electrical power contact forming a first high-frequency power socket, the first high-frequency power terminal being inserted into the first high-frequency power socket and contacting the high-frequency electrical contact.

18. The electronic assembly of claim 16 wherein the semiconductor package substrate further includes:

a first ground plane over the first insulating layer;

a second ground plane over the intermediate insulating layer;

first and second ground contact terminals on the final insulating layer;

at least first ground via in the final and intermediate insulating layers, connecting the first ground plane to the first contact terminal;

at least second ground via in the final insulating layer, connecting second ground plane to the second contact terminal; and a ground shunt bar connecting the first ground plane to the second ground plane, the ground shunt bar projecting from the first surface of the first surface of the first insulating layer to form a ground shunt terminal, the socket substrate further having a ground shunt opening formed therein, and the socket further including:

an electrical ground shunt contact in the ground shunt opening, the ground shunt opening and the electrical contact forming a ground shunt socket, the ground shunt terminal being inserted into the ground shunt socket and contacting the electrical ground shunt contact.

19. The electronic assembly of claim 17 wherein the semiconductor package substrate further includes:

a first ground plane over the first insulating layer;

a second ground plane over the intermediate insulating layer;

first and second ground contact terminals on the final insulating layer;

at least first ground via in the final and intermediate insulating layers, connecting the first ground plane to the first contact terminal;

at least second ground via in the final insulating layer, connecting second ground plane to the second contact terminal; and a ground shunt bar connecting the first ground plane to the second ground plane, the ground shunt bar projecting from the first surface of the first surface of the first insulating layer to form a ground shunt terminal, the socket substrate further having a ground shunt opening formed therein, and the socket further including:

an electrical ground shunt contact in the ground shunt opening, the ground shunt opening and the electrical contact forming a ground shunt socket, the ground shunt terminal being inserted into the ground shunt socket and contacting the electrical ground shunt contact.

20. The electronic assembly of claim 19 wherein the semiconductor package substrate further includes:

first and second high-frequency ground terminals on a first surface of the first insulating layer;

at least a first high-frequency ground via in the first insulating layer, connecting the first ground plane to the first high-frequency ground terminal; and at least a second high-frequency ground via in the first insulating layer, and the intermediate insulating layer, connecting the second ground plane to the second high-frequency ground terminal, and the socket substrate further has a first high-frequency ground opening, the socket further including:

a first electrical high-frequency ground contact in the high-frequency ground opening, the first high-frequency ground opening and the first high-frequency electrical ground contact forming a high-frequency ground socket, the first high-frequency ground terminal being inserted into the first high-frequency ground socket and contacting the first high-frequency electrical contact.

* * * * *